(12) United States Patent
Yang et al.

(10) Patent No.: US 12,315,791 B2
(45) Date of Patent: May 27, 2025

(54) METAL-INSULATOR-METAL CAPACITOR WITHIN METALLIZATION STRUCTURE

(71) Applicant: Taiwan Semiconductor Manufacturing Company LTD, Hsinchu (TW)

(72) Inventors: Chi-Han Yang, Hsinchu (TW); Lung-Hui Chen, Hsinchu (TW); Shih Chan Wei, New Taipei (TW); Kuan-Yu Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/226,861

(22) Filed: Jul. 27, 2023

(65) Prior Publication Data
US 2025/0038102 A1 Jan. 30, 2025

Related U.S. Application Data

(63) Continuation of application No. 17/395,779, filed on Aug. 6, 2021, now Pat. No. 11,855,230.

(51) Int. Cl.
*H01L 23/522* (2006.01)
*H01L 23/00* (2006.01)
(Continued)

(52) U.S. Cl.
CPC .......... *H01L 23/5223* (2013.01); *H01L 24/03* (2013.01); *H01L 24/05* (2013.01);
(Continued)

(58) Field of Classification Search
CPC .......... H01L 23/5223; H01L 23/49827; H01L 21/7687; H01L 28/40; H01L 28/60;
(Continued)

(56) References Cited

U.S. PATENT DOCUMENTS 6,281,535 B1 8/2001 Ma et al.
7,300,840 B2 * 11/2007 Lin ..................... H01L 23/5223
438/634

(Continued)

FOREIGN PATENT DOCUMENTS

KR 2004008432 A * 1/2004
KR 1020040004809 A 1/2016

OTHER PUBLICATIONS

KR20040004809—Machine English Translation (Year: 2024).*
KR20040008432—Machine English Translation (Year: 2024).*

*Primary Examiner* — Jose R Diaz
(74) *Attorney, Agent, or Firm* — Lippes Mathias LLP (57) ABSTRACT

A metallization structure of an integrated circuit (IC) includes: an intermetal dielectric (IMD) layer; a patterned metal layer embedded in the IMD layer; a patterned top metal layer disposed on the IMD layer; electrical vias comprising via material passing through the IMD layer and connecting the patterned top metal layer and the patterned metal layer embedded in the IMD layer; and a metal-insulator-metal (MIM) capacitor. The MIM capacitor includes: a first capacitor metal layer comprising the via material contacting an MIM capacitor landing area of the patterned metal layer embedded in the IMD layer; a second capacitor metal layer comprising the via material contacting a first MIM capacitor terminal area of the patterned top metal layer; and an insulator layer disposed between the first capacitor metal layer and the second capacitor metal layer.

20 Claims, 9 Drawing Sheets

(51) Int. Cl.
*H10D 1/00* (2025.01)
*H10D 1/68* (2025.01)

(52) U.S. Cl.
CPC ............ *H10D 1/042* (2025.01); *H10D 1/716* (2025.01); *H01L 2224/03622* (2013.01); *H01L 2224/05082* (2013.01); *H01L 2224/05124* (2013.01); *H01L 2224/05147* (2013.01); *H01L 2224/05157* (2013.01); *H01L 2224/05176* (2013.01); *H01L 2224/05184* (2013.01); *H01L 2224/05186* (2013.01); *H01L 2224/05573* (2013.01); *H01L 2224/05624* (2013.01); *H01L 2224/05647* (2013.01); *H01L 2224/05686* (2013.01); *H01L 2924/04941* (2013.01); *H01L 2924/04953* (2013.01)

(58) Field of Classification Search
CPC ... H01L 28/90–92; H01L 29/94; H10D 1/042; H10D 1/716
See application file for complete search history.

(56) References Cited

U.S. PATENT DOCUMENTS

| | | |
|---|---|---|
| 2004/0087098 A1 | 5/2004 | Ng et al. |
| 2007/0034988 A1 | 2/2007 | Won et al. |
| 2016/0027864 A1 | 1/2016 | Yang |
| 2017/0213896 A1 | 7/2017 | Lisiansky et al. |

* cited by examiner

METAL-INSULATOR-METAL CAPACITOR WITHIN METALLIZATION STRUCTURE

This application is a divisional application of U.S. application Ser. No. 17/395,779 filed Aug. 6, 2021, which is incorporated herein by reference in its entirety.

BACKGROUND

The following relates to integrated circuit (IC) arts, back end of line (BEOL) fabrication arts, and to related arts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated circuit (IC) fabrication process is sometimes divided into front end-of-line (FEOL) and back end-of-line (BEOL) stages. The FEOL stage entails fabrication of transistors, charge storage devices, and other circuit components. The BEOL stage entails fabrication of a metallization structure that interconnects the various circuit components to form the complex circuitry of the IC. The metallization structure typically includes an intermetal dielectric (IMD) layer with one or more patterned metal layers embedded in the IMD layer, and a top patterned metal layer disposed on the IMD layer. Each metal layer is patterned in a specific pattern that defines electrical paths or traces, and these paths or traces of the metal layers collectively provide the electrical interconnections of the circuit components of the IC to form the IC circuitry. Such electrical paths or traces connections may be direct or indirect (e.g. an upper metal layer may be patterned to define traces connecting areas of a lower buried patterned metal layer). Electrical vias electrically vertically connect traces or paths of the different patterned metal layers of the metallization structure and the patterned top metal layer disposed on the IMD. A final packaging step entails performing ball bonding, wire bonding, or the like to wire contact pads of the BEOL metallization structure to electrical power, signal ports, or the like, along with other possible processes such as mounting the IC, encapsulating the IC, or so forth, so as to install the IC into a functioning electronic device, system, or so forth.

The contact pads of the BEOL may serve as wire bonding pads or flip-chip bonding pads. In these contacting schemes, a bonding ball of solder or another material is deposited onto the contact pads to low electrical resistance contact. Some contact pads may also serve as probe pads for needle probes or the like of IC testing equipment. The contact pad should therefore be robust against electrical contacting methods such as wire bonding or contacting with a needle probe. In ICs with small feature size, a big via which is many times larger than a regular via can be used to provide support for a metal pad.

The metallization structure also may include resistors formed in a patterned layer of a high resistivity (HiR) material embedded in the IMD layer, such as titanium nitride (TiN), tantalum nitride (TaN), or the like; as well as capacitors. These components can be used for various purposes, such as forming RC circuits for tuning of microwave signals, providing charge/discharge capacitors for capacitive charge pumps of BiCMOS circuitry, providing decoupling capacitors, and so forth. The BEOL capacitor is typically embedded in the IMD layer and comprises a metal-insulator-metal (MIM) capacitor defined by two metal layers spaced apart by a thin insulator layer. One of the patterned metal layers of the metallization structure which is used for IC electrical interconnect traces or paths can also serve as a bottom metal layer of the MIM capacitor. However, the top metal layer is an extra layer used only for the BEOL MIM capacitors.

In embodiments disclosed herein, improved BEOL MIM capacitor devices and corresponding methods of manufacture are disclosed. These approaches integrate the MIM capacitor fabrication into the fabrication of the big via and other vias connecting with the top metal layer. The disclosed fabrication approaches reduce process cost and improve process cycle time.

Figure 1:
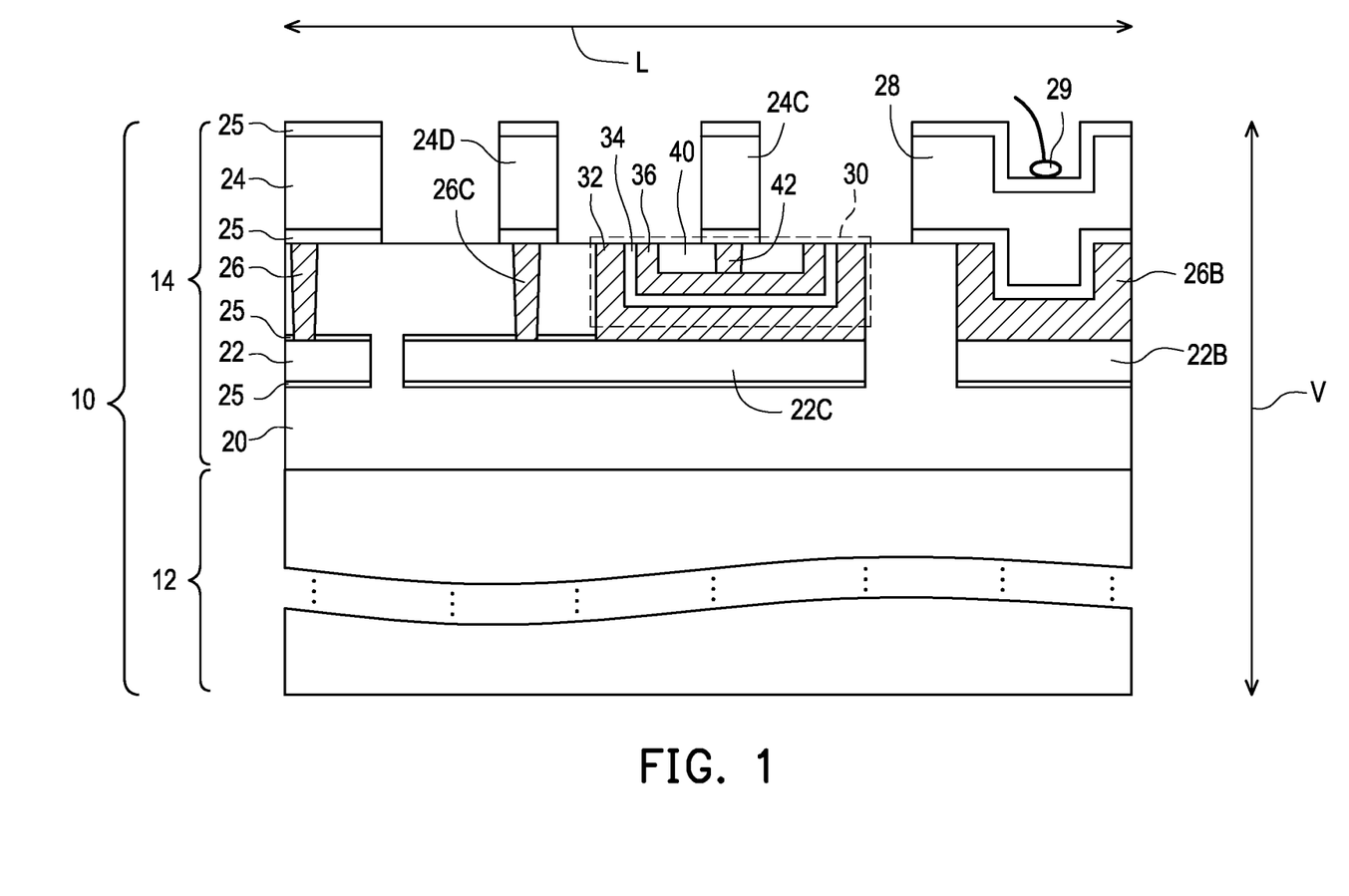
FIG. 1 diagrammatically illustrates a cross-sectional view of an integrated circuit (IC) including a metallization structure with a contact and a MIM capacitor according to an embodiment.

With reference to FIG. 1, a cross-sectional view is diagrammatically shown of an integrated circuit (IC) 10. The IC 10 includes a FEOL device structure 12 comprising transistors, charge storage devices, and other circuit components fabricated on a semiconductor wafer. For example, if the IC 10 is a silicon-based IC, then the device structure 12 may include a silicon wafer on which is fabricated various types of field effect transistors (FETs) such as planar FETs, fin-FETs, gate-all-around (GAA) FETs, and/or so forth; charge storage devices such as charge-coupled devices (CCDs) or FET-based charge storage devices, MIM capacitors, and/or so forth. Depending on the purpose of the IC 10, the circuit components of the device structure 12 may additionally include optoelectronic devices such as photodiodes, phototransistors, and/or so forth. The device structure also may include shallow trench isolation (STI) regions, n-type and/or p-type doped layers, and so forth.

The IC 10 further includes a BEOL metallization structure 14 that includes an intermetal dielectric (IMD) layer 20, and at least one patterned metal layer 22 is embedded in the IMD layer. While a single embedded patterned metal layer 22 is shown, it will be appreciated that there may be multiple patterned metal layers in the metallization structure. A top patterned metal layer 24 is disposed on the IMD layer 20.

For convenience in the description of the metallization structure 14, vertical and lateral directions may be referred to herein, as well as comparative upper and lower descriptive terms such as above, below, beneath, top, bottom, or so forth. These descriptive terms are referenced to the plane of the substrate of the IC 10, such as the silicon wafer (or a transfer substrate in a case in which the electronic device layers are transferred from the growth silicon substrate to a different host substrate during a wafer transfer process performed in the FEOL). The vertical direction V labeled in FIG. 1 is perpendicular to the wafer of the IC 10. An upper element or component of the metallization structure 14 is more distant from the device structure 12 along the vertical direction V as compared with a lower element or component of the metallization structure 14 which is closer to the device structure 12 along the vertical direction V. The patterned top metal layer 24 is therefore the uppermost element or component of the metallization structure 14, as it is furthest away from the device structure 12. Similarly, the at least one patterned metal layer 22 is beneath the top patterned metal layer 24. The indicated lateral direction(s) L refers to any direction that is transverse to the vertical direction V, i.e. a lateral direction is parallel with the principal surface of the wafer on which the components of the device structure 12 are fabricated.

The at least one buried patterned metal layer 22 and the top patterned metal layer 24 are patterned in the lateral directions to define electrical traces interconnecting components of the device structure 12, for providing landing pads for contacts, or other electrical interconnect features. While a single buried metal layer 22 is shown for illustrative purposes, in a complex IC there may be several buried metal layers embedded in the IMD layer 20 at different vertical levels, i.e. multiple metallization layers. Electrical vias 26 pass through the IMD layer 20 and connect the patterned top metal layer 24 and the patterned metal layer 22 embedded in the IMD layer 20. If there are multiple embedded layers in the IMD layer 20 then similar electrical vias (not shown) suitably connect the various metallization layers. Further electrical vias (not shown) also connect the lowermost embedded metal layer with the device structure 12.

The IMD layer 20 is suitably made of an IMD material which is a suitable dielectric material. For example, the IMD material can be un-doped silicate glass (USG), silicon dioxide ($SiO_2$), SiOCN, SiOCH, various combinations thereof, and/or so forth. Furthermore, typically the buried and top patterned metal layers 22, 24 are made of a metal layer material, and the vias 26 are made of a via material that is different from the metal layer material. For example, the metal layer material may be aluminum, copper, or an alloy of aluminum and copper, and the via material may be tungsten. This is merely an illustrative example, and more generally the metal layer material can be aluminum, copper, tungsten, cobalt, ruthenium, various alloys or multilayers thereof, or so forth. Similarly, more generally the via material may be tungsten, zinc, gold, nickel, various alloys thereof, or so forth. Still further, in some embodiments of the buried and top metal layers 22, 24 may include titanium nitride (TiN) or other cladding 25 of the metal layer material (e.g. AlCu). Other types of cladding material are also contemplated, such as tantalum nitride (TaN) or another metal nitride alloy cladding. As yet a further variant, the top patterned metal layer 24 and each of the one or more buried patterned metal layers 22 may have different material constitution.

In the example of FIG. 1, one illustrated via of the electrical vias is a "big" via 26B. The big via 26B is substantially larger than other illustrated electrical vias, and contacts a large area of the patterned top metal layer 24 which defines a contact pad 28. Hence, the big via 26B is also referred to herein as a contact pad via 26B. The contact pad 28 is of sufficiently large area to facilitate bonding during packaging of the IC 10. For example, FIG. 1 diagrammatically shows a bonding ball 29 disposed on the contact pad 28 for use in wire bonding (as shown) or flip-chip bonding, or the like. In other embodiments, the contact pad 28 may be used as a landing site for a probe of an electrical testing device, such as an oscilloscope probe, voltmeter probe, or so forth. A contact pad landing area 22B of the patterned metal layer 22 embedded in the IMD layer is arranged underneath the contact pad 28. The contact pad landing area 22B, big via 26B, and contact pad 28 typically have comparable lateral areas. In some illustrative embodiments, the big via 36B has a largest lateral dimension of at least 30 microns, and in the range 30-200 microns in some embodiments. By contrast, the other (i.e. non-big) vias 26 may in some embodiments have a largest lateral dimension of 0.1 micron, and a largest lateral dimension in the range 0.1 to 0.5 micron in some embodiments. In some embodiments, the big via 26B has a largest lateral dimension that is at least 50 times larger than a largest lateral dimension of the small (i.e. non-big) vias of the plurality of small vias 26. The illustrative contact pad via 26B has a bottom and a sidewall. It should also be noted that while FIG. 1 illustrates a single contact pad 28 with a single underlying big via 28 and further underlying contact pad landing area 22B of the embedded patterned metal layer 22, the IC 10 may in general include one, two, three, or more contact pads with corresponding underlying big vias and contact pad landing areas. The different contact pads may provide for electrical contact during packaging to different parts of the IC, such as electrical contact of $V_{CC}$ and ground terminals and various signal inputs and outputs.

In a typical IC fabrication process, the device structure 12 is manufactured in front end-of-line (FEOL) processing, followed by metallization performed during back end-of-line (BEOL) processing which forms the metallization structure 14. However, this division of processing is not necessarily strictly followed in a given IC fabrication process. For example, the FEOL processing may include forming some electrical interconnects between components of the device structure 12. Similarly, there may be devices formed in the BEOL processing, such as an illustrative metal-insulator-metal (MIM) capacitor 30 formed during the BEOL processing as a component of the metallization structure 14.

Consequently, the MIM capacitor 30 is also referred to herein as a BEOL capacitor 30, or as a BEOL MIM capacitor 30.

As diagrammatically shown in FIG. 1, the MIM capacitor 30 includes a bottom capacitor metal 32, an insulator layer 34, and a top capacitor metal 36. The insulator layer 34 suitably comprises a thin layer of silicon oxide, silicon nitride, silicon glass, a high dielectric constant (high-k) material such as tantalum oxide (e.g. $TaO_2$ or $Ta_2O_5$), hafnium oxide ($HfO_2$), aluminum oxide (e.g., $Al_2O_3$), zirconium oxide (e.g., $ZrO_2$), yttrium oxide (e.g., $Y_2O_3$), multilayer structures of such materials, or so forth.

In embodiments disclosed herein, the bottom capacitor metal 32 and the top capacitor metal 36 both comprise the via material—that is, the bottom capacitor metal 32 and the top capacitor metal 36 both comprise the same material as the vias 26. For example, in some embodiments, the bottom capacitor metal 32 and the top capacitor metal 36 both comprise tungsten, as do the vias 26 (including the big via 26B) in this specific embodiment. As seen in FIG. 1, the bottom capacitor metal 32 connects with an area 22C of the patterned metal layer 22 that is embedded in the IMD layer 20. Hence, this area 22C is also referred to herein as an MIM capacitor landing area 22C of the patterned metal layer 22 embedded in the IMD layer 20. The top capacitor metal 36 connects with an area 24C of the top patterned metal layer 24. Hence, this area 24C is also referred to herein as a first MIM capacitor terminal area 24C of the patterned top metal layer 24.

Because the top and bottom capacitor metals 32, 36 comprise the via material, the MIM capacitor 30 can be considered to comprise a via 32, 36 (also referred to herein as first via 32, 36) with the dielectric layer 34 embedded in the first via 32, 36. The insulator layer 34 of the MIM capacitor 30 thus divides the first via 32, 36 into: (i) a via portion 32 galvanically contacting the MIM capacitor landing area 22C of the patterned metal layer 22 embedded in the IMD layer 20; an (ii) a via portion 36 galvanically contacting the first MIM capacitor terminal area 24C of the patterned top metal layer 22. To provide a second terminal for electrically contacting the capacitor 30, a second via 26C of the electrical vias 26 connects the MIM capacitor landing area 22C of the patterned metal layer 22 embedded in the IMD layer 20 with a second MIM capacitor terminal area 24D of the patterned top metal layer 24. Hence, the capacitance of the MIM capacitor 30 is presence across the terminals 24C, 24D.

Figure 2:
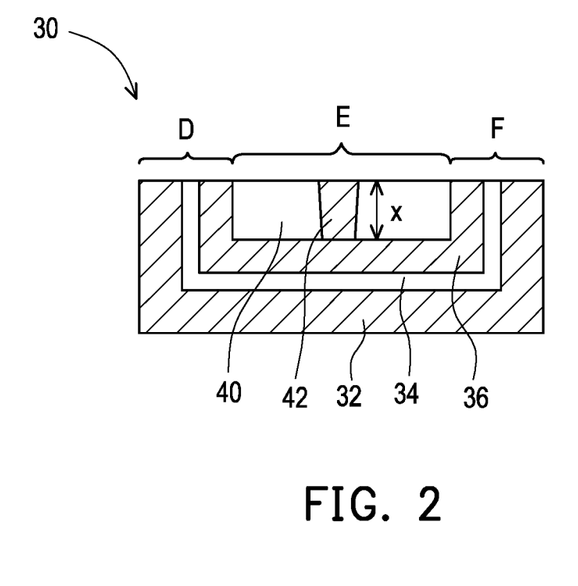
FIG. 2 diagrammatically illustrates a cross-sectional isolation view of the MIM capacitor of the metallization structure of FIG. 1.

With reference to FIG. 2, an isolation cross-sectional view of the MIM capacitor 30 is diagrammatically shown, with the bottom capacitor metal 32, insulating layer 34, and top capacitor metal 36 again shown. As can be seen in FIGS. 1 and 2, each of these layers 32, 34, 36 has a bottom and sidewall, and the sidewall has lateral dimension D and F indicated in FIG. 2. In general, the lateral dimension D is greater than zero and the lateral dimension F is greater than zero (i.e., the sidewall has finite lateral width). In some embodiments, D=F, although this is not necessary. The top metal layer 36 defines an inner volume of vertical dimension x and of lateral dimension E, which is filled with a dielectric material 40 that is typically (although not necessarily) the same material as the IMD material of the IMD layer 20. The top capacitor metal 36 also includes a connecting portion 42 in the inner volume of dimension E, again made of the same via material as the electrical vias 26 (including the big via 26B) and the bulk of the top capacitor metal 36. The connecting portion 42 passes through the dielectric material 40 and electrically connects the bulk of the top capacitor metal 36 to the first MIM capacitor terminal area 24C of the patterned top metal layer 24 (see FIG. 1).

Figure 3:
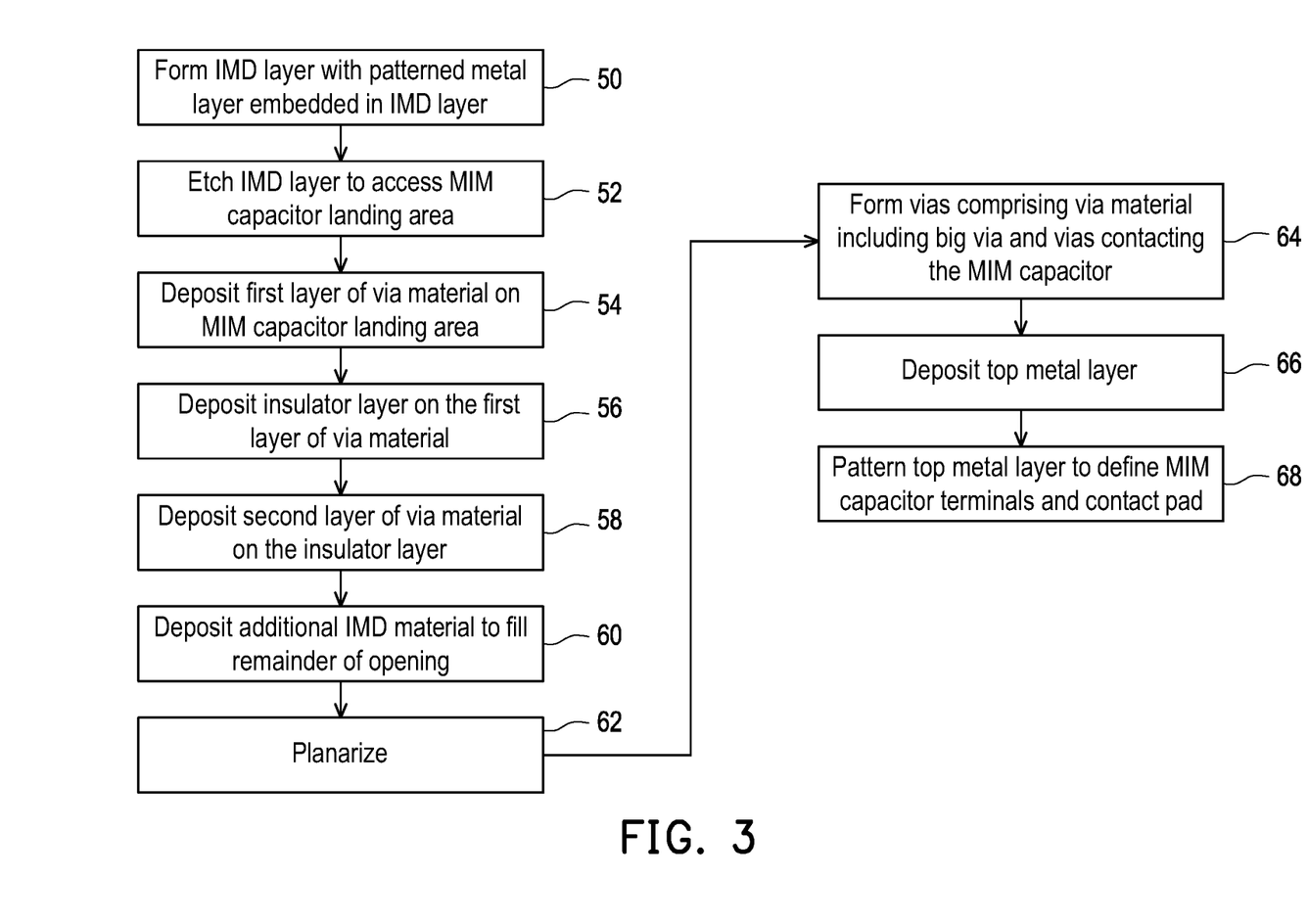
FIG. 3 diagrammatically illustrates a at least a portion of a back end-of-line (BEOL) fabrication process including fabrication of a contact pad and a BEOL MIM capacitor according to an embodiment.

With reference to FIGS. 3-14, an illustrative approach for fabricating a metallization structure such as (by way of non-limiting illustrative example) the metallization structure 14 of FIG. 1 is described. FIG. 3 shows the fabrication process by way of a flowchart. FIGS. 4-14 diagrammatically show cross-sectional views of the BEOL metallization structure under fabrication at various steps of the BEOL fabrication process of FIG. 3. FIGS. 4-14 depict the fabrication of the structure of FIGS. 1 and 2; however, it will be appreciated that the BEOL processing of FIG. 3 is not limited to fabrication of that metallization structure 14.

Figure 4:
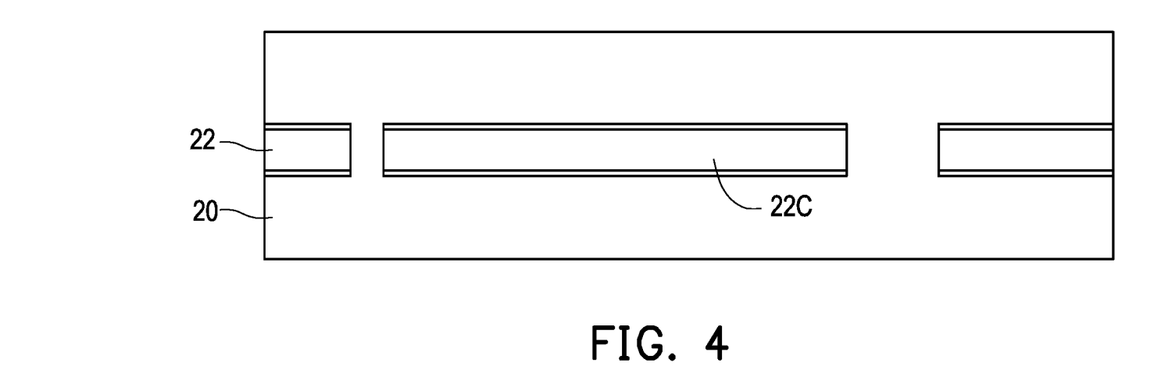
FIGS. 4-14 diagrammatically show cross-sectional views of the BEOL metallization structure under fabrication at various steps of the BEOL fabrication process of FIG. 3.

In an operation 50 of FIG. 3 and with further reference to FIG. 4, the IMD layer 20 is formed with the patterned metal layer 22 embedded in the IMD layer 20. This fabrication operation can be done in various ways. In a typical approach, the portion of the IMD layer 20 beneath the patterned metal layer 22 is first deposited, followed by deposition of a continuous metal layer that is then lithographically patterned to form the patterned metal layer 22. If the metallization structure includes two (or more) buried patterned metal layers, this process may be repeated for each additional buried patterned metal layer. Finally, the portion of the IMD layer 20 above the topmost buried patterned metal layer 22 is deposited to bury that topmost layer and thus form the structure diagrammatically shown by cross-section in FIG. 4.

Figure 5:
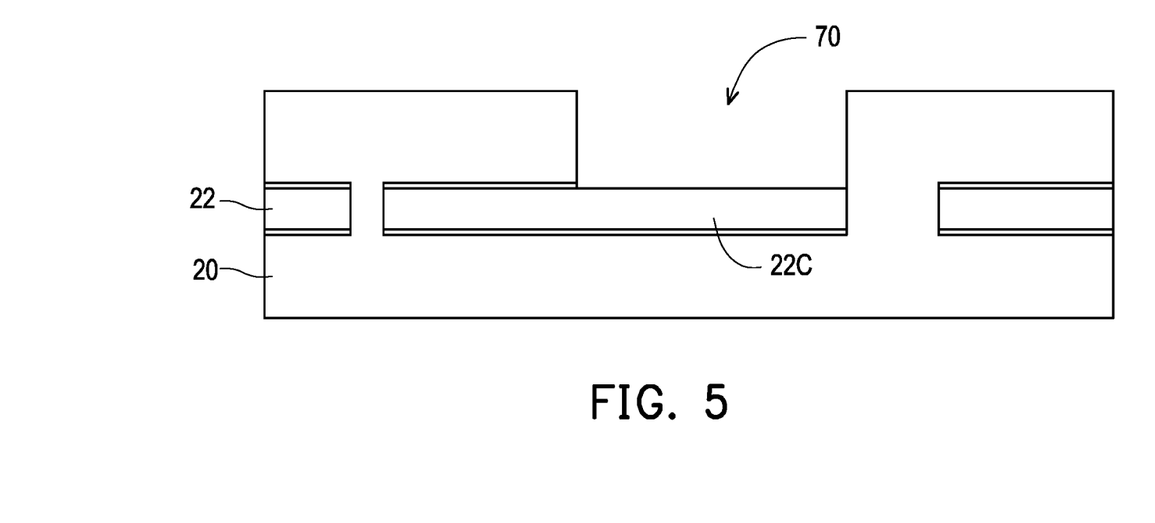

In an operation 52 of FIG. 3 and with further reference to FIG. 5, the formation of the BEOL capacitor 30 begins by etching the IMD layer to access the MIM capacitor landing area 22C. As seen in FIG. 5, this results in an opening 70 being formed in the IMD layer 20 that exposes the upper surface of the MIM capacitor landing area 22C. The operation 52 suitably employs photoresist patterning to define an opening in the resist corresponding to the opening 70 followed by etching the IMD layer 20 in that photoresist opening. The etching can employ any type of etching process that selectively etches the IMD material over the metal of the buried patterned metal layer 22. Advantageously, the MIM capacitor landing area 22C serves as a suitable etch stop.

Figure 6:
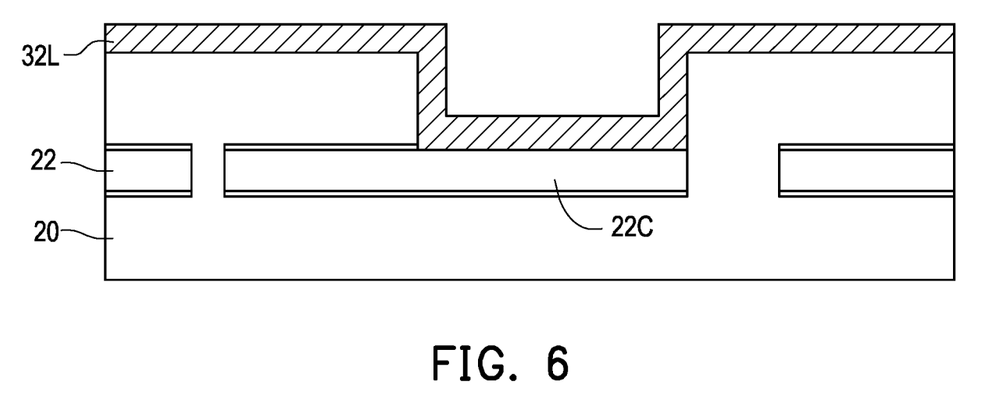

In an operation 54 of FIG. 3 and with further reference to FIG. 6, a first layer of via material 32L is deposited. In the illustrative example as seen in FIG. 6, the operation 54 deposits the first layer 32L on the portion of the MIM capacitor landing area 22C exposed by the opening 70, and also deposits the first layer 32L outside of the exposed portion of the MIM capacitor landing area 22C, that is, on the portion of the IMD layer 20 that was not removed in the operation 54. This excess deposition will be removed later in the process so as to leave only the bottom capacitor metal 32—the distinction is indicated in FIG. 6 by use of the label 32L to indicate the deposited layer. The deposition operation 54 may use any deposition technique suitable for depositing the via material. For example, the deposition may be by vacuum evaporation, sputter deposition, electroplating, physical vapor deposition (PVD), chemical vapor deposition (CVD), atomic layer deposition (ALD), or so forth.

Figure 7:
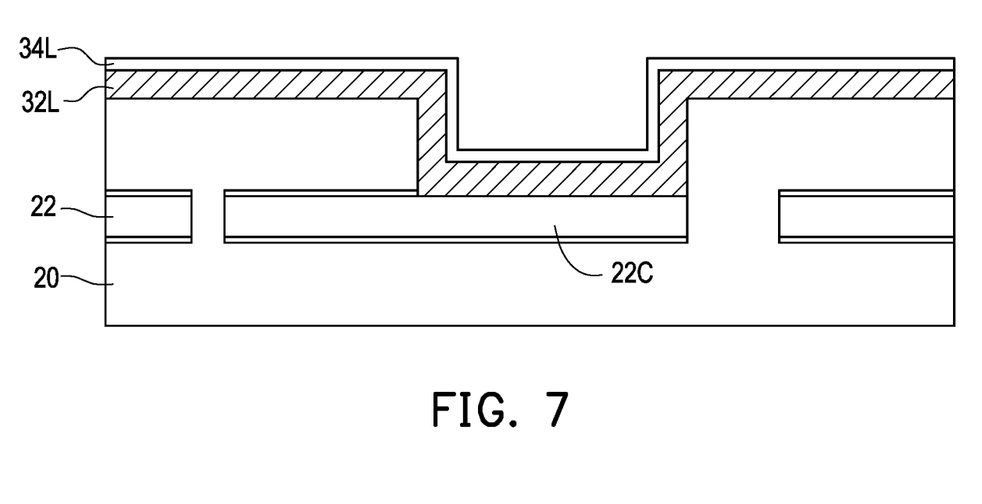

In an operation 56 of FIG. 3 and with further reference to FIG. 7, an insulator layer 34L is deposited on top of the first layer 32L. Again, the label 34L indicates the entire deposited layer, most of which will later be removed so as to leave only the insulating layer 34 of the MIM capacitor 30. The deposition operation 56 may use any deposition technique suitable for depositing the silicon oxide, silicon nitride, silicon glass, high-k material such as $TaO_2$, $Ta_2O_5$, $HfO_2$, $Al_2O_3$, $ZrO_2$, $Y_2O_3$, or other insulating material that will make up the insulating layer 34 of the MIM capacitor 30. For example, the deposition may be by vacuum evaporation, sputter deposition, electroplating, PVD, CVD, ALD, or so forth.

Figure 8:
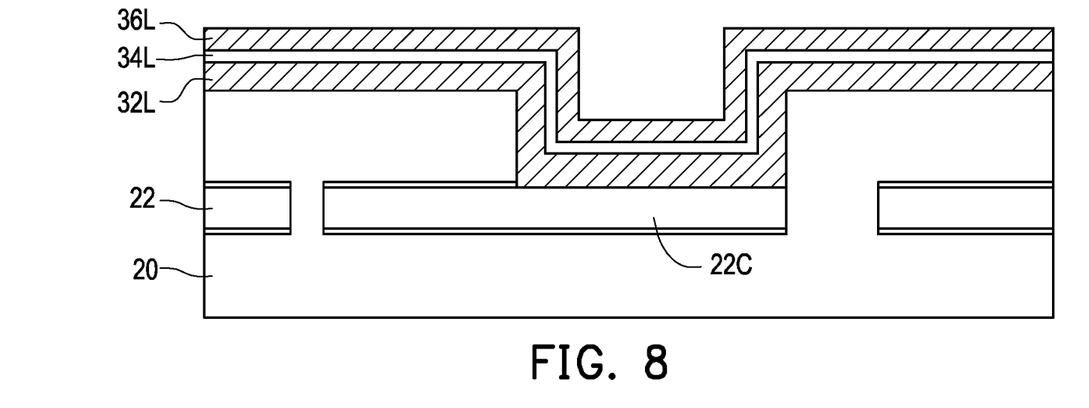

In an operation 58 of FIG. 3 and with further reference to FIG. 8, a second layer of via material 36L is deposited on the insulating layer 34L. Again, the label 36L indicates the entire deposited layer, most of which will later be removed so as to leave only the top capacitor metal 36 of the MIM capacitor 30. The deposition operation 58 may again use any deposition technique suitable for depositing the via material, such as vacuum evaporation, sputter deposition, electroplating, PVD, CVD, ALD, or so forth.

Figure 9:
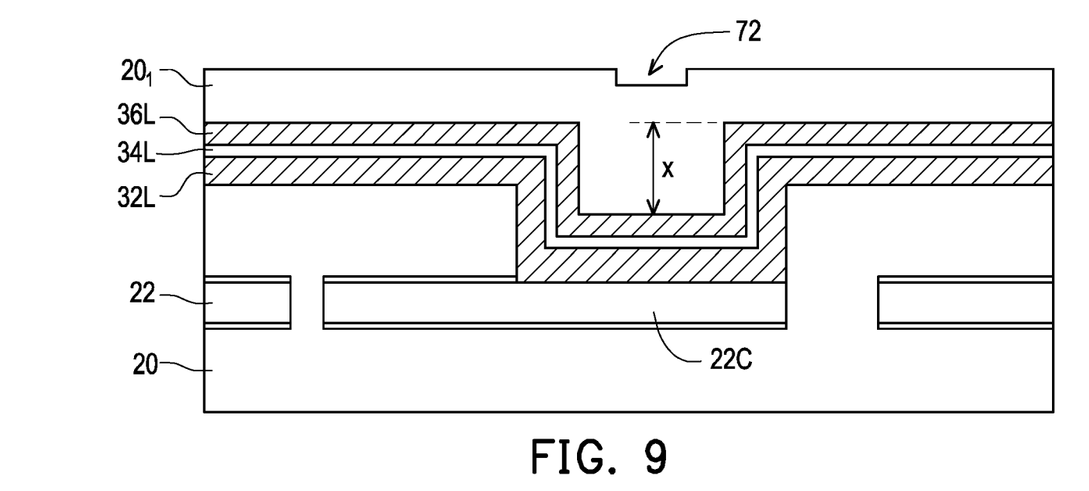
Figure 10:
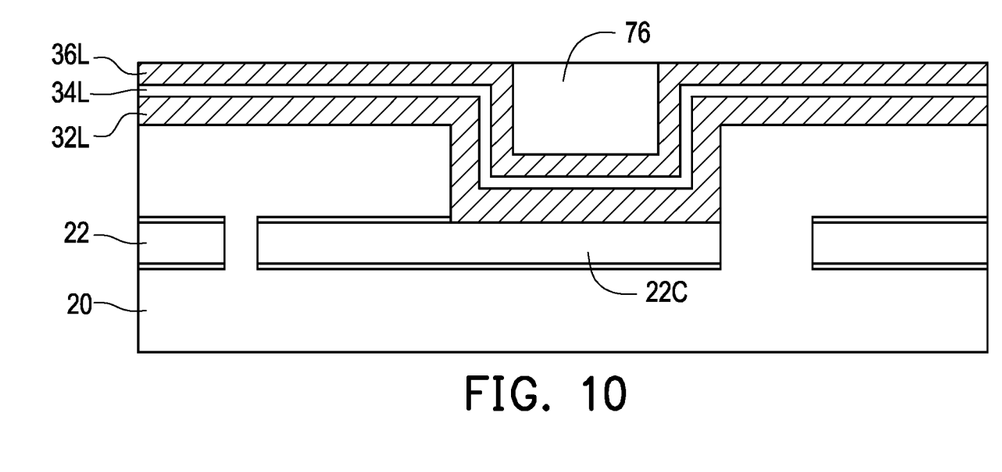

In an operation 60 of FIG. 3 and with further reference to FIG. 9, additional IMD material $20_1$ is deposited to at least a thickness x corresponding to the remainder of the opening 70 (see FIG. 5) that was not filled in by the deposition operations 54, 56, 58. Comparison with FIG. 2 shows that the thickness x shown in FIG. 9 is the same as the thickness x of FIG. 2. As further seen in FIG. 9, the thickness to which the additional IMD material $20_1$ is deposited can optionally exceed the thickness x, which is merely a minimum thickness. The deposition operation 60 may use any deposition technique suitable for depositing the USG, silicon dioxide, SiOCN, SiOCH, or other IMD material. For example, the deposition may be by vacuum evaporation, sputter deposition, electroplating, PVD, CVD, ALD, or so forth.

Notably, the top surface of the additional IMD material $20_1$ is not expected to be perfectly planar, because a surface pit or depression 72 is likely to be present due to the IMD material that fills the remainder of the opening 70.

Figure 11:
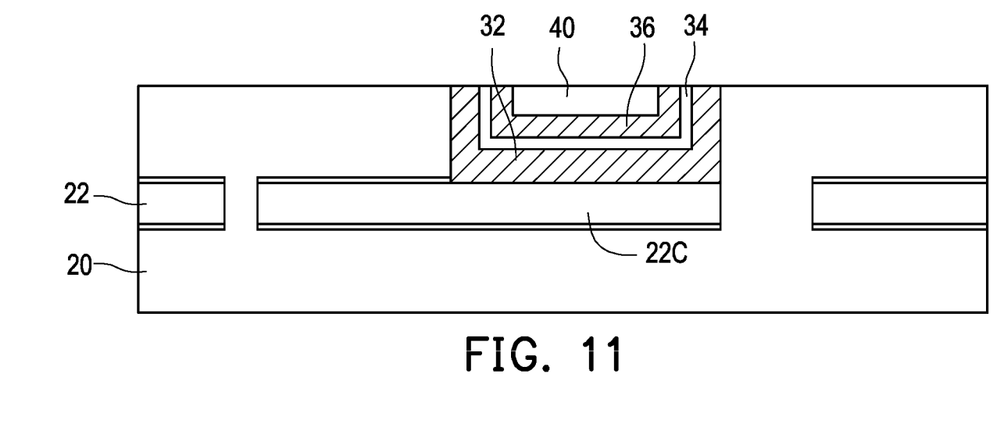

Accordingly, a planarization operation 62 is performed to planarize the surface. The planarization operation 62 may, for example, employ grinding or chemical mechanical polishing (CMP) to remove the additional IMD material $20_1$ down to the level of the top of the second layer 36L, as diagrammatically shown in FIG. 10. This leaves IMD material disposed only in a recess of the second layer of via material 36L. With reference to FIG. 11, a further CMP step, or further grinding, removes the via material of the first and second layers 32L, 36L of via material along with the thin insulator layer 34L therebetween except where those layers 32L, 34L, 36L coat the opening 70 formed in the operation 52 (see FIG. 5). This leaves the bottom capacitor metal 32, the insulator layer 34, and the top capacitor metal 36 of the capacitor 30, along with the dielectric material 40, as shown in FIG. 11. The further CMP for removing the via material may use a different etchant chemical than the CMP that removed the additional IMD material. Alternatively, both may be removed in a single continuous grinding or CMP operation. The planarization operation 62 may be timed based on calibration runs to provide the planarization to the desired depth, i.e. stopping at the second layer of via material 36L, or may be monitored using optical reflectometry or the like to ensure the planarization stops at the point when the first layer 32L has been fully removed outside of the opening 70.

Figure 12:
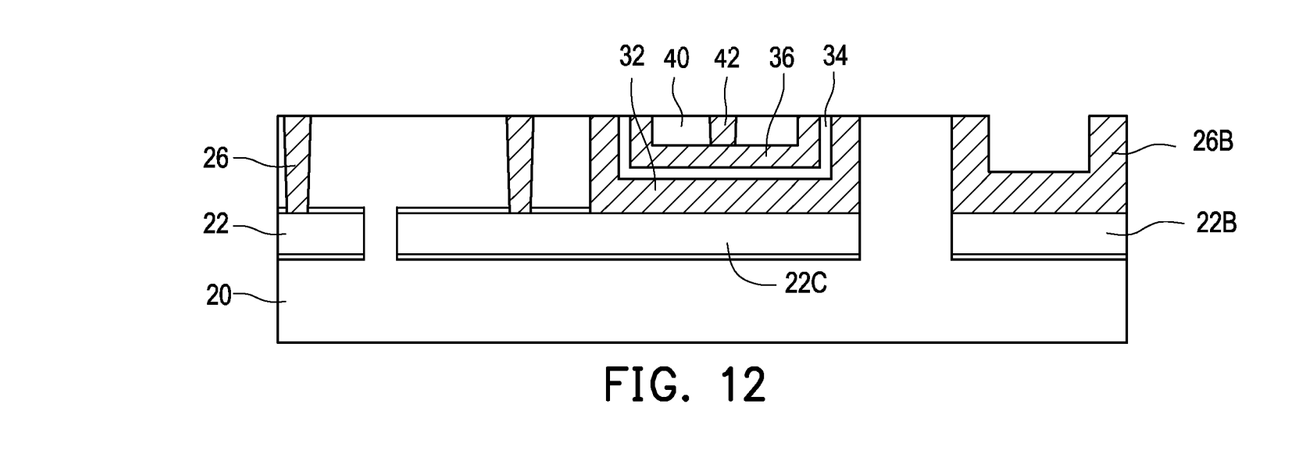

In an operation 64 of FIG. 3 and with further reference to FIG. 12, formation of the electrical vias 26 is next performed. This entails photolithographically patterned etching to form the openings for the vias 26 (including a relatively large opening for the big via 26B, and also an opening for the connecting portion 42 of the top capacitor metal 36, cf. FIG. 2), and subsequent deposition of the via material into those openings (optionally using the same patterned photoresist as used for the etching), followed by optional CMP to planarize the surface. The operation 64 can suitably employ any electrical via fabrication process used in BEOL processing. In the illustrative embodiment, the contact pad via 26B has a bottom and a sidewall due to the large area of the opening that is coated with the via material during the operation 64.

Figure 13:
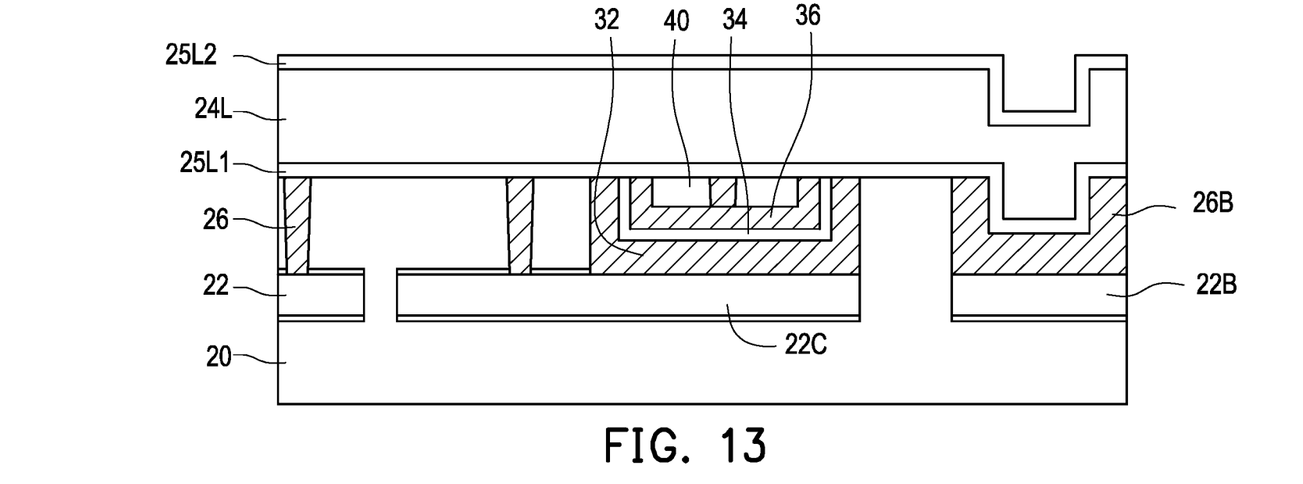

In an operation 66 of FIG. 3 and with further reference to FIG. 13, a top metal layer 24L is deposited. The label 24L is used to distinguish the continuous top metal layer 24L from the patterned top metal layer 24 to be formed by patterning in the next step. The deposition operation 66 may use any deposition technique suitable for depositing the metal layer material (e.g., aluminum, copper, or an alloy of aluminum and copper, in various illustrative embodiments) of the top metal layer 24L. For example, the deposition may be by vacuum evaporation, sputter deposition, electroplating, physical vapor deposition (PVD), chemical vapor deposition (CVD), atomic layer deposition (ALD), or so forth. Moreover, in the illustrative example of FIG. 13, the deposition operation 66 includes depositing a lower cladding layer 25L1 prior to depositing the metal layer material, and depositing an upper cladding layer 25L2 after depositing the metal layer material. Again, the labels 25L1 and 25L2 for the continuous cladding layers 25L1 and 25L2 are used differentiate these continuous cladding layers from the patterned cladding layers 25 of the patterned top metal layer 24.

Figure 14:
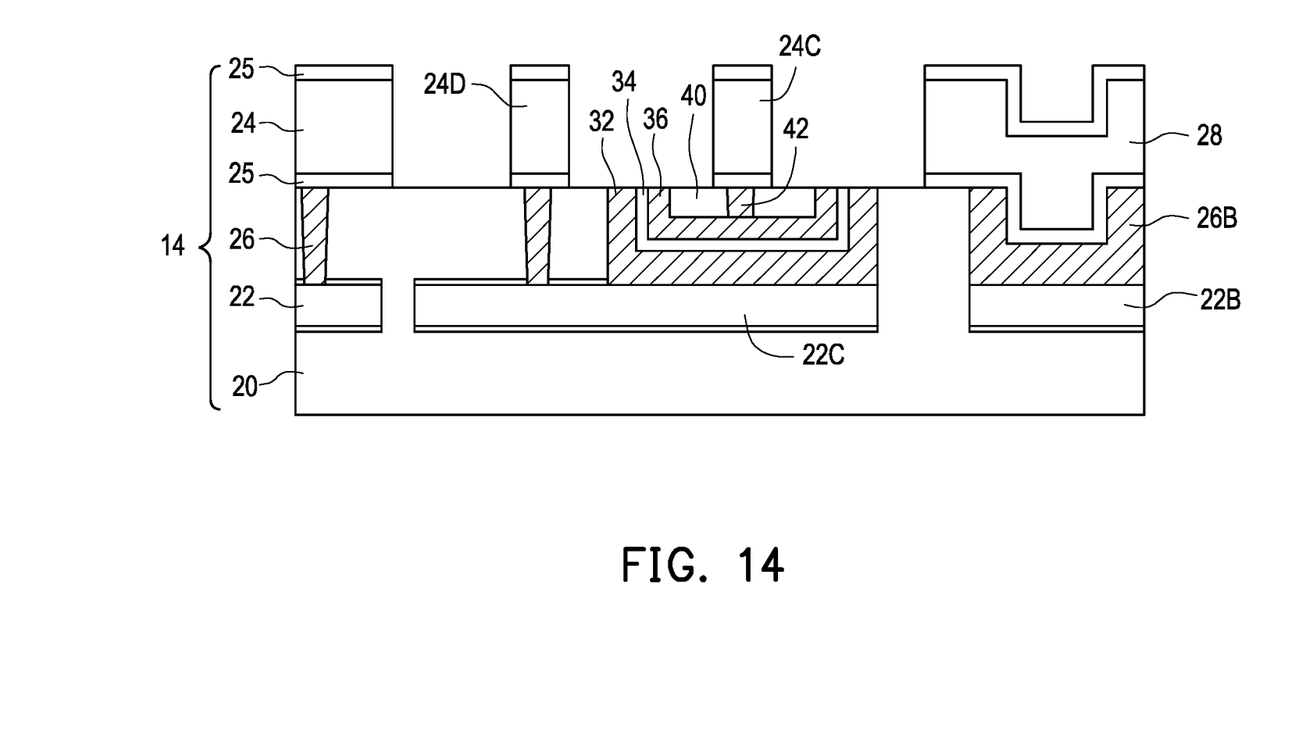

In an operation 68 of FIG. 3 and with further reference to FIG. 14, the continuous top metal layer 24L is lithographically patterned to form the patterned top metal layer 24, including the previously described contact pad 28 and the first and second terminals 24C, 24D of the capacitor 30. This completes the BEOL processing of FIG. 3 and produces the metallization structure 14 as shown in FIG. 14.

In the illustrative example of FIGS. 3-14, a single BEOL capacitor 30 is fabricated. However, more generally the BEOL processing of FIG. 3 may be used to concurrently fabricate any number of BEOL capacitors. To do so, in the operation 50 the buried patterned metal layer 22 is suitably patterned to define an MIM capacitor landing area 22C for each BEOL capacitor to be fabricated. In the operation 52, the photomask used to define the lithographic pattern for the accessing MIM capacitor landing areas defines an opening 70 (see FIG. 5) at the location of, and sized to correspond to, each respective MIM capacitor landing area 22C. The following operations 54, 56, 58, and 60 performing blanket deposition of layers and the planarization 62 can be performed over the entire wafer, or over at least an area of the wafer encompassing all locations where BEOL capacitors are to be formed, and hence these operations are not modified in the case of fabricating multiple BEOL capacitors. In the operation 64, the via formation includes forming the connecting portion 42 of the top capacitor metal 36 for each respective capacitor, which again merely entails appropriate modification of the photomask used in the via formation operation 64. The subsequent blanket top metal layer deposition operation 66 is again not modified, and the final top metal layer patterning operation 68 again entails modifying the photomask used in this operation to define the first and second terminals 24C and 24D for each respective BEOL capacitor.

Similarly, while the illustrative examples of FIGS. 3-14 forms a single illustrative contact pad 28 with underlying big via 26B and contact pad landing area 22B of the buried patterned metal layer 22, this can be readily modified to fabricate multiple contact pads by appropriate modification of the photomasks used to pattern the buried patterned metal layer 22, the via formation, and the top metal layer patterning.

In the following, some additional illustrative embodiments are disclosed.

In some illustrative embodiments, an integrated circuit includes a device structure comprising circuit components, and a metallization structure disposed on the device structure and providing electrical interconnects for the circuit components of the device structure. The metallization structure includes an intermetal dielectric (IMD) layer, a patterned metal layer embedded in the IMD layer, a patterned top metal layer disposed on the IMD layer, electrical vias passing through the IMD layer and connecting the patterned top metal layer and the patterned metal layer embedded in the IMD layer, and a metal-insulator-metal (MIM) capacitor. The MIM capacitor includes a first via of the electrical vias and an insulator layer embedded in the first via.

In some illustrative embodiments, a method of manufacturing a metallization structure of an integrated circuit (IC) is disclosed. An intermetal dielectric (IMD) layer is formed, comprising IMD material with a patterned metal layer embedded in the IMD layer. A metal-insulator-metal (MIM) capacitor is formed by operations including: etching the IMD to access an MIM capacitor landing area of the patterned metal layer embedded in the IMD layer, depositing a first layer of via material on the MIM capacitor landing area, depositing an insulator layer on the first layer of via material, and depositing a second layer of via material on the insulator layer. Vias are formed, comprising the via material. The formed vias include a first MIM capacitor via contacting the second layer of via material and a second MIM capacitor via contacting the MIM capacitor landing area and an IC contact pad via. A top metal layer is deposited and patterned to define first and second MIM capacitor terminals disposed on the respective first and second MIM capacitor vias and an IC contact pad disposed on the IC contact pad via.

In some illustrative embodiments, a metallization structure of an integrated circuit (IC) includes: an intermetal dielectric (IMD) layer; a patterned metal layer embedded in the IMD layer; a patterned top metal layer disposed on the IMD layer; electrical vias comprising via material passing through the IMD layer and connecting the patterned top metal layer and the patterned metal layer embedded in the IMD layer; and a metal-insulator-metal (MIM) capacitor. The MIM capacitor includes: a first capacitor metal layer comprising the via material contacting an MIM capacitor landing area of the patterned metal layer embedded in the IMD layer; a second capacitor metal layer comprising the via material contacting a first MIM capacitor terminal area of the patterned top metal layer; and an insulator layer disposed between the first capacitor metal layer and the second capacitor metal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a metallization structure of an integrated circuit (IC), the method comprising;
    forming an intermetal dielectric (IMD) layer comprising IMD material with a patterned metal layer embedded in the IMD layer;
    forming a metal-insulator-metal (MIM) capacitor by operations including:
        etching the IMD to access an MIM capacitor landing area of the patterned metal layer embedded in the IMD layer,
        depositing a first layer of via material on the MIM capacitor landing area,
        depositing an insulator layer on the first layer of via material, and
        depositing a second layer of via material on the insulator layer;
    forming vias comprising the via material including a first MIM capacitor via contacting the second layer of via material and a second MIM capacitor via contacting the MIM capacitor landing area, and an IC contact pad via;
    depositing and patterning a top metal layer to define first and second MIM capacitor terminals disposed on the respective first and second MIM capacitor vias and an IC contact pad disposed on the IC contact pad via; and
    disposing a bonding ball on the IC contact pad, the bonding ball configured for use in wire bonding to the IC or flip chip bonding of the IC.

2. The method of claim 1 wherein the depositing of the first and second layers of via material also deposit via material outside of the MIM capacitor landing area, and the forming of the MIM capacitor further includes chemical mechanical polishing (CMP) to remove the via material deposited outside of the MIM capacitor landing area.

3. The method of claim 2 wherein the forming of the MIM capacitor further includes:
    depositing IMD material on the second layer of via material;
    wherein the CMP also removes the IMD material deposited on the second layer of via material outside of the MIM capacitor landing area.

4. The method of claim 2 wherein the patterned metal layer embedded in the IMD layer comprises a metal layer material and the via material is different from the metal layer material.

5. The method of claim 2 wherein:
    the patterned metal layer embedded in the IMD layer comprises aluminum, copper, or an alloy of aluminum and copper; and
    the via material comprises tungsten or a tungsten alloy.

6. The method of claim 1 wherein the forming of the IMD layer comprising the IMD material with the patterned metal layer embedded in the IMD layer includes:
    depositing a first portion of the IMD layer;
    depositing a continuous metal layer on the first portion of the IMD layer;
    lithographically patterning the continuous metal layer to form the patterned metal layer; and
    depositing a second portion of the IMD layer on the patterned metal layer.

7. The method of claim 1 wherein:
    the etching of the IMD forms an opening in the IMD layer which exposes the MIM capacitor landing area; and
    the first layer of via material, the insulator layer, and the second layer of via material are deposited on the bottom and sidewall of the opening in the IMD layer, with the first layer of via material contacting the MIM capacitor landing area.

8. The method of claim 7 further comprising:
after depositing the first layer of via material, the insulator layer, and the second layer of via material on the bottom and sidewall of the opening in the IMD layer, filling a remainder of the opening in the IMD layer with IMD material;
wherein the forming of the first MIM capacitor via contacting the second layer of via material includes forming the first MIM capacitor via passing through the IMD material filling the remainder of the opening in the IMD layer to contact the second layer of via material.

9. The method of claim 8 wherein:
the first layer of via material, the insulator layer, and the second layer of via material are also deposited outside of the opening in the IMD layer; and
the method further comprises removing the portion of the first layer of via material, the portion of the insulator layer, and the portion of the second layer of via material deposited outside of the opening in the IMD layer so that the MIM capacitor is disposed inside the opening in the IMD layer.

10. The method of claim 1, wherein the bonding balls are bonding balls of solder.

11. A semiconductor manufacturing method comprising:
performing front end-of-line (FEOL) processing to form an integrated circuit (IC); and
performing back end-of-line (BEOL) processing including the method of manufacturing the metallization structure of the IC as set forth in claim 1.

12. A method of manufacturing a metallization structure of an integrated circuit (IC), the method comprising:
forming at least one patterned metal layer embedded in intermetal dielectric (IMD) material;
etching an opening in the IMD material that exposes a capacitor landing area of the at least one patterned metal layer;
forming a metal-insulator-metal (MIM) capacitor disposed in the opening in the IMD material, the MIM capacitor filling a portion of the opening in the IMD material and including a first layer of via material formed on the exposed capacitor landing area and on a sidewall of the opening in the IMD material, an insulator layer disposed on the first layer of via material, and a second layer of via material disposed on the insulator layer;
filling a remainder of the opening in the IMD material with additional IMD material;
forming vias comprising the via material including a first MIM capacitor via passing through the additional IMD material and contacting the second layer of via material and a second MIM capacitor via contacting the at least one patterned metal layer and electrically contacting the first layer of via material, wherein the forming of the vias further includes forming a plurality of IC contact pad vias; and
depositing and patterning a top metal layer to define first and second MIM capacitor terminals disposed on the respective first and second MIM capacitor vias, the depositing and patterning of the top metal layer includes patterning the top metal layer to form IC contact pads disposed on the respective IC contact pad vias; and
disposing bonding balls on the IC contact pads.

13. The method of claim 12 wherein the least one patterned metal layer embedded in the IMD material and the top metal layer comprise aluminum and/or copper comprise a material that is different from the via material.

14. The method of claim 12 wherein:
the via material comprises tungsten, a tungsten alloy, zinc, a zinc alloy, gold, a gold alloy, nickel, or a nickel alloy;
the at least one patterned metal layer embedded in the IMD material comprises aluminum and/or copper;
the top metal layer comprises aluminum and/or copper; and
the insulator layer comprises at least one layer of silicon oxide, silicon nitride, silicon glass, tantalum oxide, hafnium oxide, aluminum oxide, zirconium oxide, or yttrium oxide.

15. The method of claim 12 wherein the bonding balls are bonding balls of solder.

16. The method of claim 12 wherein the forming of the MIM capacitor disposed in the opening in the IMD material and the filling of the remainder of the opening in the IMD material with additional IMD material comprises:
depositing the first layer of via material, the insulator layer, the second layer of via material, and the additional IMD material both in the opening in the IMD material and outside of the opening in the IMD material; and
performing planarization to remove the portions of the first layer of via material, the insulator layer, the second layer of via material, and the additional IMD material deposited outside of the opening in the IMD material.

17. A semiconductor manufacturing method comprising:
performing front end-of-line (FEOL) processing to form an integrated circuit (IC); and
performing back end-of-line (BEOL) processing to form a metallization structure of the IC comprising a plurality of patterned metal layers spaced apart by intermetal dielectric (IMD) material;
wherein the BEOL processing includes forming at least one metal-insulator-metal (MIM) capacitor including:
a first layer of via material having a bottom portion disposed on and contacting a MIM capacitor landing area of a patterned metal layer of the plurality of patterned metal layers and further having a sidewall portion disposed on the IMD material,
an insulator layer having a bottom portion disposed on the bottom portion of first layer of via material and further having a sidewall portion disposed on the sidewall portion of the first layer of via material;
a second layer of via material having a bottom portion disposed on the bottom portion of the insulator layer and further having a sidewall portion disposed on the sidewall portion of the insulator layer; and
forming an IC contact pad that has a bottom and a sidewall surrounding the bottom.

18. The method of claim 17 further comprising:
filling a space delineated by the bottom and sidewall portions of the second layer of via material with additional IMD material;
forming vias comprising the via material including a first MIM capacitor via passing through the additional IMD material and contacting the second layer of via material and a second MIM capacitor via contacting the at least one patterned metal layer and electrically contacting the first layer of via material; and
depositing and patterning a top metal layer to define first and second MIM capacitor terminals disposed on the respective first and second MIM capacitor vias.

19. The method of claim 18 wherein:
the via material comprises tungsten, a tungsten alloy, zinc, a zinc alloy, gold, a gold alloy, nickel, or a nickel alloy; and the plurality of patterned metal layers embedded in the IMD material comprise aluminum and/or copper; and
the top metal layer comprises aluminum and/or copper.

20. The method of claim 17, further comprising disposing a bonding ball on the bottom of the IC contact pad.

\* \* \* \* \*